(12) United States Patent
Sasaki et al.

(10) Patent No.: US 11,664,200 B2
(45) Date of Patent: May 30, 2023

(54) PLACING TABLE, POSITIONING METHOD OF EDGE RING AND SUBSTRATE PROCESSING APPARATUS

(71) Applicant: Tokyo Electron Limited, Tokyo (JP)

(72) Inventors: Yasuharu Sasaki, Miyagi (JP); Toshiya Tsukahara, Miyagi (JP); Mitsuaki Sato, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 795 days.

(21) Appl. No.: 16/671,416

(22) Filed: Nov. 1, 2019

(65) Prior Publication Data

US 2020/0144036 A1    May 7, 2020

(30) Foreign Application Priority Data

Nov. 5, 2018 (JP) .............................. JP2018-207907

(51) Int. Cl.
*H01J 37/32* (2006.01)

(52) U.S. Cl.
CPC .. *H01J 37/32715* (2013.01); *H01J 37/32642* (2013.01); *H01J 2237/2007* (2013.01)

(58) Field of Classification Search
CPC ........... H01J 37/32431; H01J 37/32458; H01J 37/32532; H01J 37/32522; H01J 37/132642; H01J 37/32697; H01J 37/32706; H01J 37/32027; H01J 37/32091; H01J 2237/2007; H01L 21/67248; H01L 21/6831; H01L 21/68735; H01L 21/68721; H01L 21/68785

See application file for complete search history.

(56) References Cited

U.S. PATENT DOCUMENTS

| | | | | |
|---|---|---|---|---|
| 6,090,304 A | * | 7/2000 | Zhu | H01L 21/31116 257/E21.252 |
| 2012/0003836 A1 | * | 1/2012 | Kellogg | H01L 21/6719 118/723 R |
| 2015/0187542 A1 | * | 7/2015 | Ishida | H01J 37/32495 156/345.1 |
| 2019/0279894 A1 | * | 9/2019 | Uchida | H01L 21/68735 |
| 2019/0355588 A1 | * | 11/2019 | Yang | H01L 21/02164 |
| 2020/0211885 A1 | * | 7/2020 | Taga | H01L 21/68757 |
| 2020/0251371 A1 | | 8/2020 | Kuno et al. | |
| 2020/0266088 A1 | * | 8/2020 | Kosakai | H01L 21/67109 |

FOREIGN PATENT DOCUMENTS

| | | |
|---|---|---|
| JP | 2008-244274 A | 10/2008 |
| JP | 2011-054933 A | 3/2011 |
| WO | 2019/088204 A1 | 5/2019 |

* cited by examiner

*Primary Examiner* — Haissa Philogene
(74) *Attorney, Agent, or Firm* — Pearne & Gordon LLP

(57) ABSTRACT

A placing table includes an edge ring disposed to surround a substrate, the edge ring having a first recess portion at a lower portion thereof; an electrostatic chuck having a first placing surface on which the substrate is placed, a second placing surface on which the edge ring is placed, and an electrode embedded therein to face the second placing surface; an annular member disposed to surround the electrostatic chuck, the annular member having a second recess portion; and an elastic member disposed in a space surrounded by the first recess portion, the electrostatic chuck and the second recess portion.

11 Claims, 7 Drawing Sheets

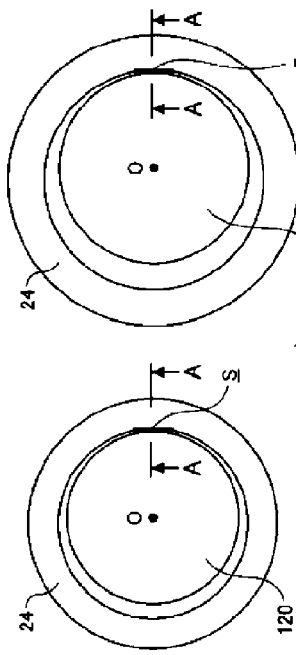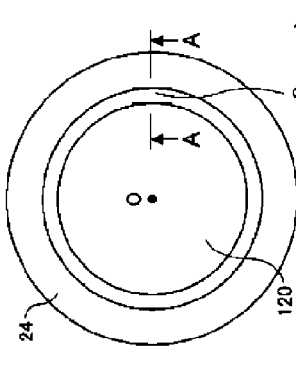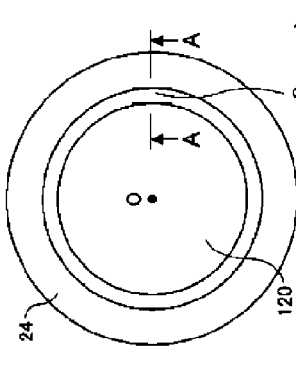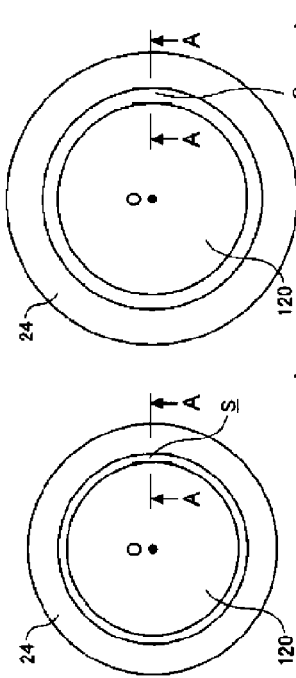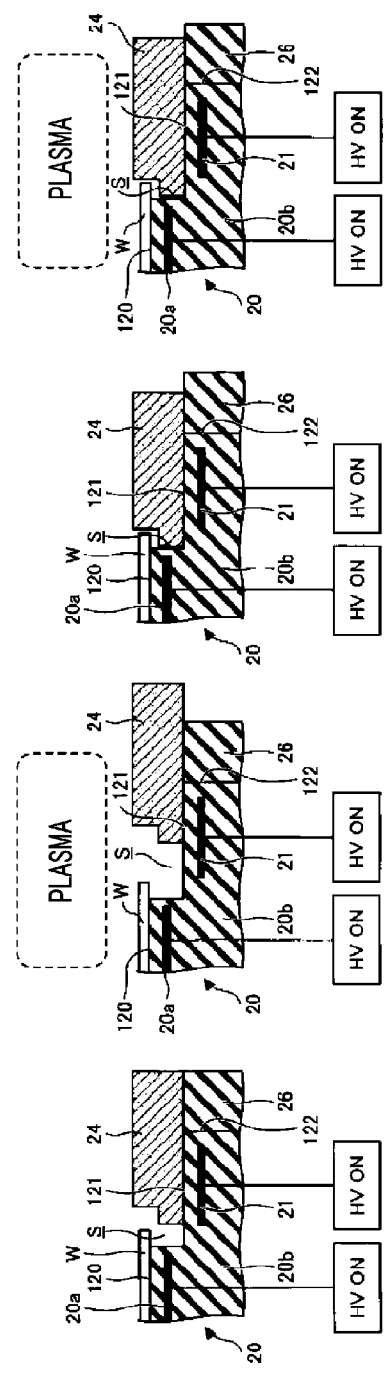

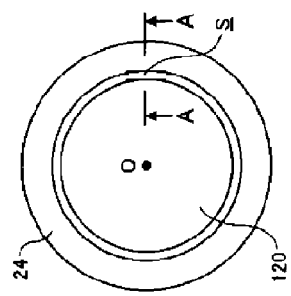
FIG. 3A
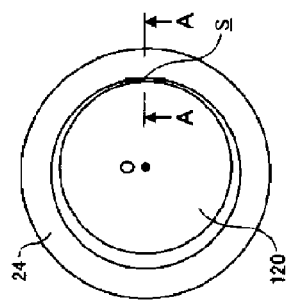
FIG. 3B
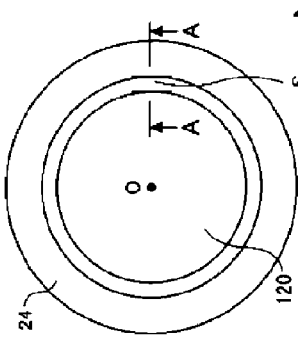
FIG. 3C
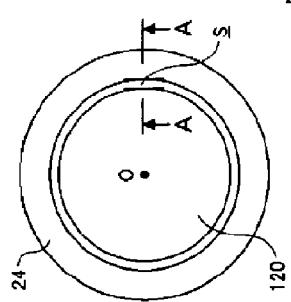
FIG. 3D
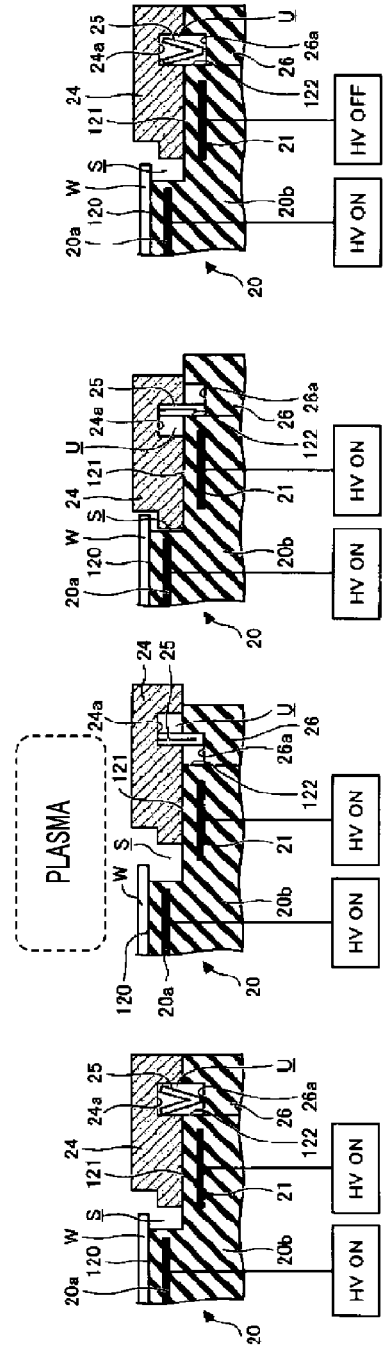

PLACING TABLE, POSITIONING METHOD OF EDGE RING AND SUBSTRATE PROCESSING APPARATUS

CROSS-REFERENCE TO RELATED APPLICATION

This application claims the benefit of Japanese Patent Application No. 2018-207907 filed on Nov. 5, 2018, the entire disclosures of which are incorporated herein by reference.

TECHNICAL FIELD

The various aspects and embodiments described herein pertain generally to a placing table, a positioning method of an edge ring and a substrate processing apparatus.

BACKGROUND

For example, Patent Document 1 describes a placing table having a wafer placing portion on a top surface thereof and an annular peripheral portion extending to an outside of the wafer placing portion. A wafer as a processing target is placed on the wafer placing portion, and a focus ring is mounted on the annular peripheral portion. A gap is provided between facing sidewalls of an edge ring and an electrostatic chuck.

Patent Docume1: Japanese Patent Laid-open Publication No. 2008-244274

SUMMARY

In one exemplary embodiment, a placing table includes an edge ring disposed to surround a substrate, the edge ring having a first recess portion at a lower portion thereof; an electrostatic chuck having a first placing surface on which the substrate is placed, a second placing surface on which the edge ring is placed, and an electrode embedded therein to face the second placing surface; an annular member disposed to surround the electrostatic chuck, the annular member having a second recess portion; and an elastic member disposed in a space surrounded by the first recess portion, the electrostatic chuck and the second recess portion.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2A to FIG. 2D are diagrams for describing deviation in a position of an edge ring caused by expansion/contraction of the edge ring due to a temperature variation;

FIG. 3A to FIG. 3D are diagrams illustrating an example of positioning of the edge ring according to the exemplary embodiment;

DETAILED DESCRIPTION

Figure 1:
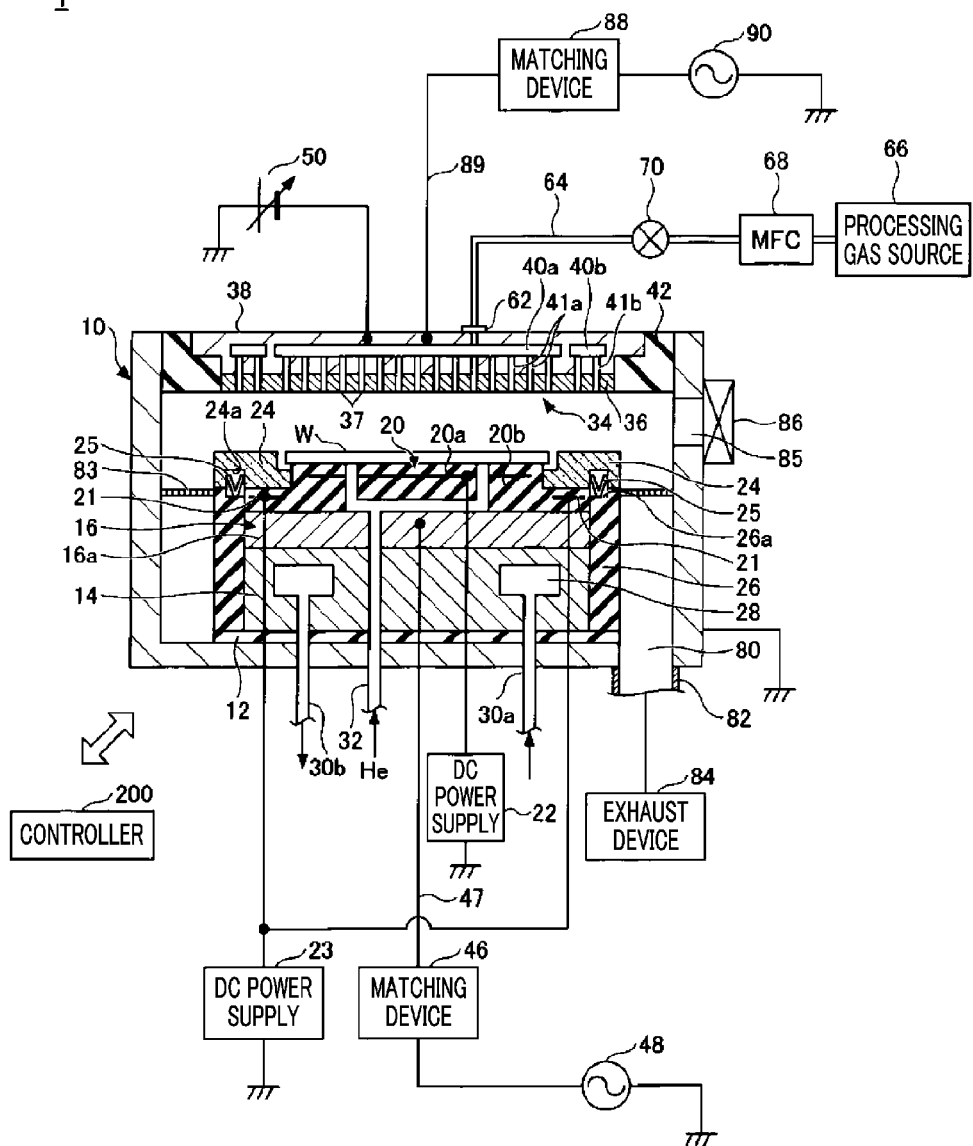
FIG. 1 is a diagram illustrating an example of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the specification and the drawings, substantially same parts will be assigned same reference numerals, and redundant description will be omitted.

[Overall Configuration of Substrate Processing Apparatus]

FIG. 1 is a diagram illustrating an example of a substrate processing apparatus 1 according to an exemplary embodiment. The substrate processing apparatus 1 according to the present exemplary embodiment is configured as a capacitively coupled parallel plate type processing apparatus, and includes a cylindrical processing vessel 10 made of, for example, aluminum having an anodically oxidized surface. The processing vessel 10 is grounded.

A column-shaped supporting table 14 is disposed at a bottom of the processing vessel 10 with an insulating plate 12 made of ceramics or the like therebetween. Provided on this supporting table 14 is a placing table 16 which is made of, by way of non-limiting example, aluminum. The placing table 16 includes an electrostatic chuck 20, a base 16a, an edge ring 24, a spring member 25 and an insulator ring 26. The electrostatic chuck 20 is configured to place thereon a wafer W as an example of a substrate. The electrostatic chuck 20 has a structure in which a first electrode 20a made of a conductive film is embedded in an insulating layer 20b, and a DC power supply 22 is connected to the first electrode 20a. The electrostatic chuck 20 may have a heater and be capable of performing a temperature control.

The conductive edge ring 24 made of, by way of example, silicon is disposed to surround the wafer W. The edge ring 24 is also called a focus ring. The insulator ring 26 having a ring shape and made of, by way of example, quartz is disposed around the electrostatic chuck 20, the base 16a and the supporting table 14. The insulator ring 26 has a step portion 26a. The insulator ring 26 is disposed to surround the electrostatic chuck 20 and corresponds to an annular member having a second recess portion. The step portion 26a is an example of the second recess portion.

The electrostatic chuck 20 has a second electrode 21 which is buried therein at a position facing the edge ring 24. The second electrode 21 is connected to a DC power supply 23. The DC power supply 22 and the DC power supply 23 apply DC voltages individually. A central portion of the electrostatic chuck 20 generates an electrostatic force such as a Coulomb force by the voltage applied to the first electrode 20a from the DC power supply 22, so that the wafer W is attracted to and held by the electrostatic chuck 20 by this electrostatic force. Further, a peripheral portion of the electrostatic chuck 20 generates an electrostatic force such as a Coulomb force by the voltage applied to the second electrode 21 from the DC power supply 23, so that the edge ring 24 is attracted to and held by the electrostatic chuck 20 by this electrostatic force.

The spring member 25 as an example of an elastic member is disposed in a space surrounded by a recess portion 24a provided at a lower portion of the edge ring 24, a recess portion (step portion 26a) provided at an inner circumferential upper corner portion of the insulator ring 26 and a sidewall of the electrostatic chuck 20. The number of the spring member 25 may be one or more. That is, a plurality of spring members 25 may be arranged at a regular distance therebetween in a circumferential direction, or a single spring member 25 may be provided in a ring shape. The spring member 25 has a function of positioning the edge ring 24. The positioning of the edge ring 24 will be elaborated later.

Within the supporting table 14, a coolant path 28 is formed along a circumference, for example. A coolant of a preset temperature, for example, cooling water is supplied to be circulated in the coolant path 28 from an external chiller unit via pipelines 30a and 30b. A temperature of the wafer W on the placing table 16 is controlled by the temperature of the coolant. Further, a heat transfer gas, for example, a He gas from a heat transfer gas supply device is supplied into a gap between a top surface of the electrostatic chuck 20 and a rear surface of the wafer W through a gas supply line 32.

An upper electrode 34 is provided above the placing table 16, facing the placing table 16. A plasma processing space is provided between the upper electrode 34 and the placing table 16.

The upper electrode 34 is configured to close an opening of a ceiling of the processing vessel 10 with an insulating shield member 42 therebetween. The upper electrode 34 includes an electrode plate 36 forming a facing surface facing the placing table 16 and having a plurality of gas discharge holes 37; and an electrode supporting body 38 configured to support the electrode plate 36 in a detachable manner and made of a conductive material, for example, aluminum having an anodically oxidized surface. It is desirable that the electrode plate 36 is made of a silicon-containing material such as SiC or silicon. Gas diffusion spaces 40a and 40b are provided within the electrode supporting body 38, and a multiple number of gas through holes 41a and 41b extend in a downward direction from these gas diffusion spaces 40a and 40b to communicate with the gas discharge holes 37, respectively.

The electrode supporting body 38 is provided with a gas inlet opening 62 through which a gas is introduced into the gas diffusion spaces 40a and 40b. This gas inlet opening 62 is connected with a gas supply line 64, and the gas supply line 64 is connected to a processing gas source 66. The gas supply line 64 is equipped with a mass flow controller (MFC) 68 and an opening/closing valve 70 in sequence from an upstream side where the processing gas source 66 is provided. A processing gas is supplied from the processing gas source 66 into the gas diffusion spaces 40a and 40b through the gas supply line 64, and the processing gas is then discharged in a shower shape through the gas through holes 41a and 41b and the gas discharge holes 37.

The upper electrode 34 is connected with a variable DC power supply 50, and a DC voltage from the variable DC power supply 50 is applied to the upper electrode 34. A first high frequency power supply 90 is connected to the upper electrode 34 via a power feed rod 89 and a matching device 88. The first high frequency power supply 90 is configured to apply a HF (High Frequency) power to the upper electrode 34. The matching device 88 is configured to match an internal impedance of the first high frequency power supply 90 and a load impedance. Accordingly, plasma is formed from the gas in the plasma processing space. Further, the HF power from the first high frequency power supply 90 may be applied to the placing table 16.

In case of applying the HF power to the upper electrode 34, a frequency of the HF power needs to be in a range from 30 MHz to 70 MHz, for example, 40 MHz. In case of applying the HF power to the placing table 16, the frequency of the HF power needs to be in a range from 30 MHz to 70 MHz, for example, 60 MHz.

A second high frequency power supply 48 is connected to the placing table 16 via a power feed rod 47 and a matching device 46. The second high frequency power supply 48 is configured to apply a LF (Low Frequency) power to the placing table 16. The matching device 46 is configured to match an internal impedance of the second high frequency power supply 48 and the load impedance. Accordingly, ions are attracted into the wafer W on the placing table 16. The second high frequency power supply 48 outputs a high frequency power having a frequency ranging from 200 kHz to 13.56 MHz. A filter configured to pass a preset high frequency power to the ground may be connected to the placing table 16.

A frequency of the LF power is lower than the frequency of the HF power and may be in a range from 200 kHz to 40 MHz, for example, 12.88 MHz. A voltage or a current of each of the LF power and the HF power may be a continuous wave or a pulse wave. As stated above, the shower head configured to supply the gas also serves as the upper electrode 34, and the placing table 16 serves as a lower electrode.

An exhaust opening 80 is provided at the bottom of the processing vessel 10, and an exhaust device 84 is connected to this exhaust opening 80 via an exhaust line 82. The exhaust device 84 has a vacuum pump such as a turbo molecular pump and evacuates the processing vessel 10 to a required vacuum level. Further, a carry-in/out opening 85 for the wafer W is provided at a sidewall of the processing vessel 10, and this carry-in/out opening 85 is opened or closed by a gate valve 86.

An annular baffle plate 83 is provided between the annular insulator ring 26 and the sidewall of the processing vessel 10. The baffle plate 83 may be an aluminum member coated with ceramics such as, but not limited to, $Y_2O_3$.

To perform a preset processing such as an etching processing in the substrate processing apparatus 1 having the above-described configuration, the gate valve 86 is first opened, and the wafer W is carried into the processing vessel 10 through the carry-in/out opening 85 to be placed on the placing table 16. Then, a gas for the preset processing such as the etching processing is supplied from the processing gas source 66 into the gas diffusion spaces 40a and 40b at a preset flow rate, and this processing gas is supplied into the processing vessel 10 through the gas through holes 41a and 41b and the gas discharge holes 37. Further, the processing vessel 10 is evacuated by the exhaust device 84. Accordingly, an internal pressure of the processing vessel 10 is regulated to a set value ranging from, e.g., 0.1 Pa to 150 Pa.

In the state that the preset gas is introduced into the processing vessel 10 as described above, the HF power is applied to the upper electrode 34 from the first high frequency power supply 90. Further, the LF power is applied to the placing table 16 from the second high frequency power supply 48. Furthermore, the DC voltage is applied from the DC power supply 22 to the first electrode 20a to hold the wafer W on the placing table 16. Further, the DC voltage is applied from the DC power supply 23 to the second electrode 21 to hold the edge ring 24 on the placing table 16. The DC voltage from the variable DC power supply 50 may also be applied to the upper electrode 34.

The gas discharged from the gas discharge holes 37 of the upper electrode 34 are dissociated and ionized into plasma mainly by the HF power, and the preset processing such as the etching processing is performed on a processing target surface of the wafer W by radicals and/or ions in the plasma. Further, by applying the LF power to the placing table 16, the ions in the plasma are controlled to accelerate the preset processing such as the etching processing.

The substrate processing apparatus 1 is equipped with a controller 200 configured to control an overall operation of the apparatus. A CPU provided in the controller 200 implements the required plasma processing such as the etching processing according to recipes stored in a memory such as a ROM or a RAM. Control information of the apparatus for processing conditions such as a processing time, a pressure (gas exhaust), HF and LF high frequency powers and voltages, flows rates of various kinds of gases, and so forth may be set in the recipes. Furthermore, temperatures within the processing vessel (a temperature of the upper electrode, a temperature of the sidewall of the processing vessel, a temperature of the wafer W, a temperature of the electrostatic chuck, etc.), a temperature of the coolant outputted from the chiller, and so forth may be set in the recipes. These recipes including the processing conditions and programs may be stored in a hard disk or a semiconductor memory. Further, the recipes may be set to a preset position and read out while being stored in a portable computer-readable recording medium such as a CD-ROM, a DVD, or the like.

[Deviation of Edge Ring Position]

Now, deviation in a position of the edge ring 24 caused by expansion/contraction due to a temperature variation will be explained with reference to FIG. 2A to FIG. 2D. Upper drawings of FIG. 2A to FIG. 2D are plan views illustrating the placing surface 120 of the electrostatic chuck 20 on which the wafer W is placed and the edge ring 24, when viewed from top, and lower drawings of FIG. 2A to FIG. 2D are partially enlarged cross sectional views illustrating the electrostatic chuck 20 and the edge ring 24, taken along lines A-A of FIG. 2A to FIG. 2D, respectively.

The electrostatic chuck 20 has a placing surface 121 lower than the placing surface 120 on which the wafer W is placed. The edge ring 24 is placed on this placing surface 121. The placing surface 120 corresponds to a first placing surface on which the substrate is placed, and the placing surface 121 corresponds to a second placing surface on which the edge ring 24 is placed.

In the upper drawings of FIG. 2A to FIG. 2D, a positional relationship between the electrostatic chuck 20 and the edge ring 24 is indicated by positions of the placing surface 120 and the edge ring 24. FIG. 2A illustrates an initial state of the positions of the placing surface 120 and the edge ring 24. The edge ring 24 is positioned to be substantially concentric with a central axis O of the electrostatic chuck 20. Hereinafter, the positioning of the edge ring 24 to be substantially concentric with the central axis O of the electrostatic chuck 20 will be referred to as "aligning." Here, a clearance S between the electrostatic chuck 20 and the edge ring 24 is controlled to be uniform.

FIG. 2B illustrates an example state where a temperature of the edge ring 24 is increased to a first temperature due to heat input from the plasma while performing the plasma processing on the wafer. Here, the edge ring 24 having a larger linear expansion coefficient than the electrostatic chuck 20 is expanded outwards, so that the clearance S is enlarged. Though the electrostatic chuck 20 is also expanded like the edge ring 24, the expansion of the electrostatic chuck 20 is smaller than that of the edge ring 24.

FIG. 2C illustrates an example state where the temperature of the edge ring 24 is set to a second temperature lower than the first temperature as the plasma is extinguished after the plasma processing. In this example, the edge ring 24 having the larger linear expansion coefficient than the electrostatic chuck 20 is contracted inwards, so that deviation of the clearance S occurs. Before and after the plasma processing shown in FIG. 2A to FIG. 2C, the edge ring 24 expands and contracts while being attracted to the electrostatic chuck 20 by a DC voltage HV applied thereto, and is deviated from the initial position (see FIG. 2A) where the edge ring 24 is substantially concentric with the electrostatic chuck 20. As a result, the edge ring 24 is moved to a position (see FIG. 2C) where it is not aligned with the electrostatic chuck 20. In the example shown in FIG. 2C, the clearance S is larger at the left and smaller at the right. The deviation illustrated in FIG. 2C is an example, and the deviation is not limited thereto.

If a next plasma processing is begun in the state of FIG. 2C, the edge ring 24 is expanded in the non-aligned state, and the clearance S becomes larger at the left, as illustrated in FIG. 2D. As stated above, whenever the plasma processing is performed on each wafer, since the clearance S between the electrostatic chuck 20 and the edge ring 24 is not managed, particularly, an abnormal discharge called a micro arcing occurs at a place where the clearance S between the electrostatic chuck 20 and the edge ring 24 is narrow. Due to this abnormal discharge, a particle is generated from the gap between the electrostatic chuck 20 and the edge ring 24 and flies onto the wafer W, so that an adverse influence is affected upon the processing of the wafer W. As a result, a yield is reduced.

During the processing shown in FIG. 2A to FIG. 2D, the DC voltage HV is applied to the first electrode 20a and the second electrode 21, so that the wafer W is electrostatically attracted to the placing surface 120 and the edge ring 24 is electrostatically attracted to the placing surface 121. However, the edge ring 24 is deviated from the position where the edge ring 24 is substantially concentric with the electrostatic chuck 20 (the central axis O) as the processes of FIG. 2A to FIG. 2D are repeated.

In contrast, according to the present exemplary embodiment, an aligning operation of the edge ring 24 is enabled, thus suppressing the edge ring 24 from being deviated from the position where it is substantially concentric with the electrostatic chuck 20. Accordingly, the clearance S between the electrostatic chuck 20 and the edge ring 24 is managed. Thus, the abnormal discharge is suppressed, so that the particle generation is avoided.

[Aligning Operation of Edge Ring]

Hereinafter, the aligning operation of the edge ring 24 according to the exemplary embodiment will be explained with reference to FIG. 3A to FIG. 3D. Upper drawings of FIG. 3A to FIG. 3D are plan views illustrating the placing surface 120 and the edge ring 24, when viewed from top. Lower drawings of FIG. 3A to FIG. 3D are partially enlarged cross sectional views illustrating the electrostatic chuck 20 and the edge ring 24 corresponding to the upper drawings of FIG. 3A to FIG. 3D.

FIG. 3A illustrates an initial state of positions of the placing surface 120 and the edge ring 24. The edge ring 24 is positioned to be substantially concentric with the central axis O of the electrostatic chuck 20. The spring member 25 is disposed in a space U surrounded by the recess portion 24a provided at the lower portion of the edge ring 24, the step portion 26a provided at the inner circumferential portion of the insulator ring 26 and a sidewall 122 of the electrostatic chuck 20. The spring member 25 has a V-shaped cross section and is configured to be expanded and contracted in a diametrical direction. The recess portion 24a at the lower portion of the edge ring 24 is an example of a first recess portion. The step portion 26a of the insulator ring 26 is an example of a second recess portion.

FIG. 3B illustrates an example of a state in which a temperature of the edge ring 24 is raised to the first temperature due to heat input from the plasma during the plasma processing. The edge ring 24 having a larger linear expansion coefficient than the electrostatic chuck 20 is expanded outward, so that the clearance S is enlarged. Accordingly, the spring member 25 is pushed outwards in the space U due to the expansion of the edge ring 24. However, the movement of the spring member 25 is suppressed by the step portion 26a of the insulator ring 26, and the spring member 25 in the contracted state allows no more outward movement of the edge ring 24.

FIG. 3C illustrates an example of a state in which the edge ring 24 is contracted when the edge ring 24 is set to have the second temperature lower than the first temperature since the plasma is extinguished after the plasma processing. Since the DC voltage HV is applied to the edge ring 24 even after the plasma processing, the edge ring 24 is contracted while being electrostatically attracted to the electrostatic chuck 20. Accordingly, the spring member 25 is pushed inwards in the space U as the edge ring 24 is contracted. However, the movement of the spring member 25 is suppressed by the sidewall 122 of the electrostatic chuck 20. Thus, the spring member 25 in the contracted state stops the inward movement of the edge ring 24.

In this state, the edge ring 24 is deviated from a position (FIG. 3A) where the edge ring 24 is substantially concentric with the electrostatic chuck 20. After the edge ring 24 is set to have the second temperature in FIG. 3C, the application of the DC voltage HV to the second electrode 21 is stopped, as depicted in the lower drawing of FIG. 3D. Here, the condition of "the edge ring 24 is set to have the second temperature" includes both a case where the edge ring 24 is actively set to have the second temperature and a case where the edge ring 24 is set to have the second temperature passively since the plasma is extinguished. Accordingly, the edge ring 24 is released from the electrostatic attracting force to the electrostatic chuck 20 and can be freely movable. As a result, the spring member 25 is expanded in the diametrical direction as shown in FIG. 3D, and the edge ring 24 is aligned and can be re-arranged at the position where the edge ring 24 is substantially concentric with the electrostatic chuck 20.

By performing the aligning operation of the edge ring 24 as stated above, the clearance S between the edge ring 24 and the electrostatic chuck 20 can be managed to be uniform. Accordingly, the abnormal discharge can be suppressed, and the particle generation from the clearance S can be avoided.

Furthermore, after the edge ring 24 is aligned by the elasticity of the spring member 25 by turning "the DC voltage off" as shown in FIG. 3D, the DC voltage is applied again, and the plasma processing shown in FIG. 3B is performed on a next wafer W. This aligning operation is repeated for each wafer W.

[Experimental Results]

Figure 4:
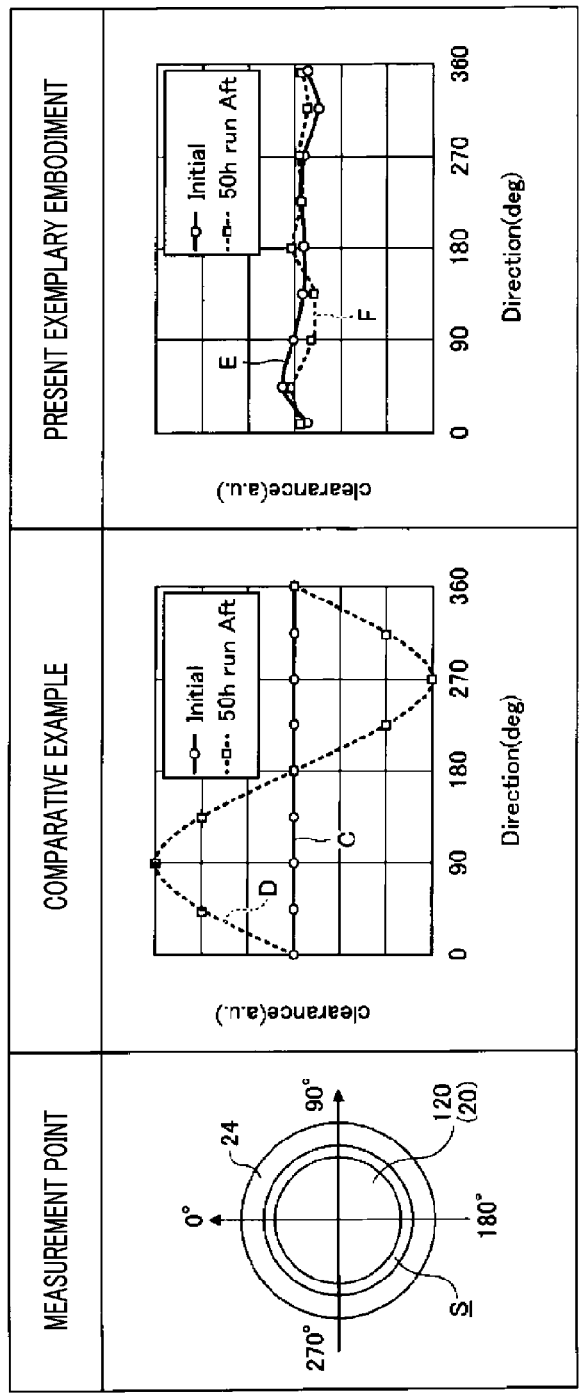
FIG. 4 is a diagram illustrating an example of an effect of the positioning of the edge ring according to the exemplary embodiment.

Referring to FIG. 4, a result of the aligning operation of the edge ring 24 according to the present exemplary embodiment will be explained in comparison with a comparative example. The comparative example of FIG. 4 shows an example of an experimental result for the clearance S between the edge ring 24 and the electrostatic chuck 20 described in FIG. 2A to FIG. 2D. Meanwhile, the present exemplary embodiment of FIG. 4 shows an example of an experimental result for the clearance S between the edge ring 24 and the electrostatic chuck 20 described in FIG. 3A to FIG. 3D. A horizontal axis of each graph indicates a measurement point of the clearance S between the edge ring 24 and the electrostatic chuck 20 at an interval of 45° with respect to a vertically upward direction of 0° (360°), a right transversal direction of 90°, a downward direction 180° and a left transversal direction of 270°. A measurement value is shown on a vertical axis indicating the clearance. The vertical axis indicates the measurement value of the clearance S at each angle in an arbitrary unit.

As a result of the experiments, in the comparative example, the clearance S in an initial state indicated by a line C is maintained uniform at each angle. Meanwhile, the clearance S after a plasma processing is performed for 50 hours is not managed uniform, as indicated by a line D. That is, the edge ring 24 is deviated from the electrostatic chuck 20 (central axis O) in the left-and-right direction.

In contrast, in the present exemplary embodiment, the clearance S in an initial state indicated by a line E is substantially maintained uniform at each angle, and the clearance S after the plasma processing is performed for 50 hours is also found to be substantially uniform at each angle, as indicated by a line F.

From the above experiments, in the placing table 16 according to the present exemplary embodiment, it is found out that the edge ring 24 is aligned with the electrostatic chuck 20 due to elasticity of the spring member 25. Further, in the present exemplary embodiment, if a maximum value of the clearance S at each angle after the plasma processing is performed for a preset time (for example, 50 hours) is larger than a threshold value Th (0.5 mm), it is determined that the clearance S is within a tolerance range, that is, the edge ring 24 is aligned with the electrostatic chuck 20.

As for a timing for turning off the DC voltage, the DC voltage may be turned off a single time every time each single sheet of wafer W is processed as shown in FIG. 3A to FIG. 3D or when a plurality of wafers W is processed. Further, the timing for turning off the DC voltage may be anytime after the plasma processing upon the current wafer W is completed and before the plasma processing upon the next wafer W is begun. For example, in case that a cleaning processing is performed after the completion of the plasma processing upon the current wafer W and before the beginning of the plasma processing upon the next wafer W, the timing of turning off the DC voltage may be after the cleaning processing or before the cleaning processing.

Besides, in case that the plasma processing upon the single sheet of wafer W is performed in multiple processes (stages), there may be the temperature variation in the multiple processes. In such a case, the temperature of the edge ring 24 may be changed between one of the multiple processes and another one. In such a case, a process of turning off the DC voltage may be inserted between the plurality of processes. Thus, the edge ring 24 can be aligned during the processing of the single sheet of wafer W.

[Elastic Member]

Figure 5:
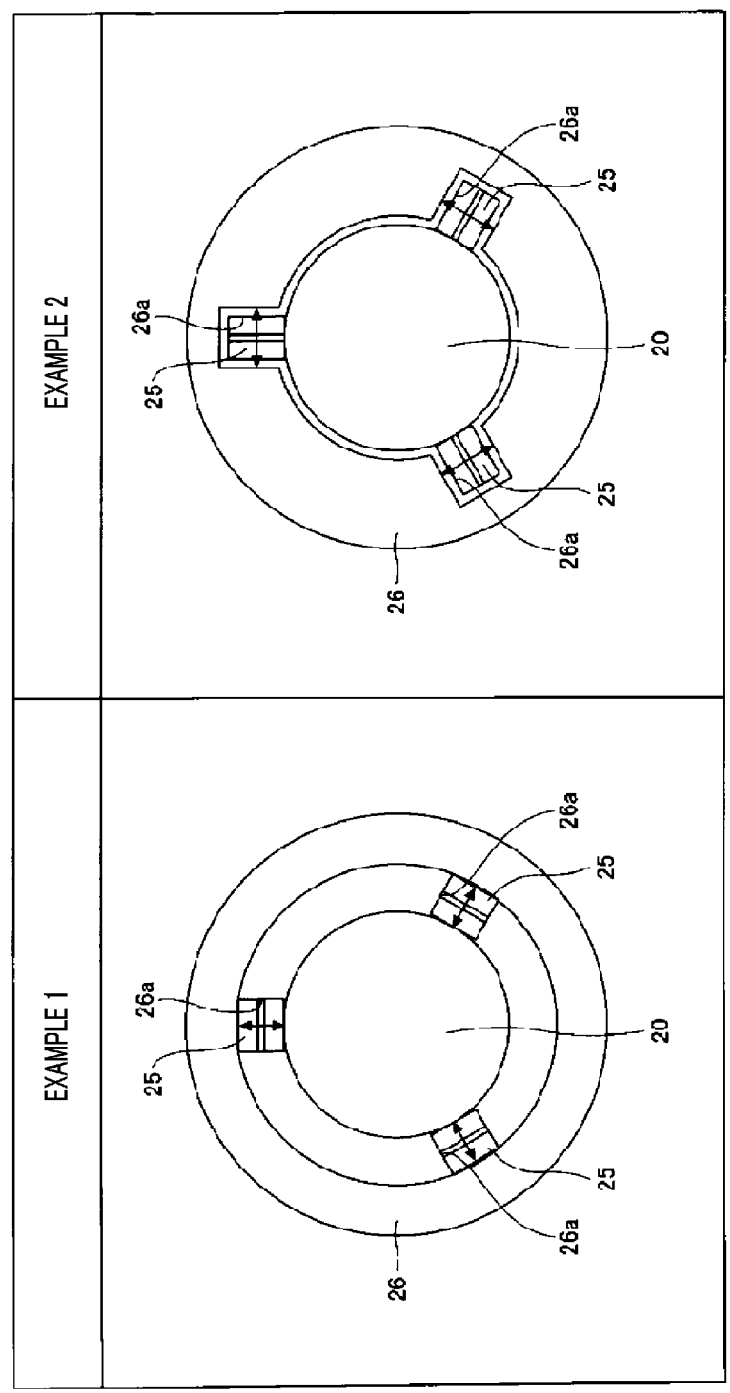
FIG. 5 is a diagram illustrating an example of an elastic member according to the exemplary embodiment.

Now, examples of the elastic member will be discussed with reference to FIG. 5. Example 1 and Example 2 of FIG. 5 illustrate the examples of the elastic member. Examples 1 and 2 of FIG. 5 are top views illustrating the electrostatic chuck 20, the spring member 25 and the insulator ring 26 provided with the step portion 26a seen from above at the height of the placing surface 121 shown in FIG. 3A and FIG. 3D.

The spring member 25 shown in Example 1 is an example of the elastic member having elasticity in the diametrical direction (normal direction). The spring member 25 shown in Example 2 is an example of the elastic member having elasticity in the circumferential direction. In Examples 1 and 2, three spring members 25 are arranged at a regular distance therebetween in the circumferential direction. The edge ring 24 may be aligned in the normal direction as in Example 1, or aligned in the circumferential direction as in Example 2. In any cases, the edge ring 24 can be aligned to be substantially concentric with the electrostatic chuck 20. Here, however, the number of the spring members 25 is not limited to three. For example, one spring member 25 may be provided in a ring shape, or two or more spring members 25 may be provided. Furthermore, though the spring member 25 is disposed such that a cross section thereof is of a V-shape in Examples 1 and 2, the exemplary embodiment is not limited thereto. The spring member 25 may be disposed such that the cross section thereof is of an inverted V-shape.

In addition, the spring member 25 is nothing more than an example of the elastic member, and the elastic member is not limited to having the spring shape. That is, the elastic member may have any other shape, besides the spring shape, as long as it has elasticity and can accomplish the aligning function. By way of example, the elastic member may be of a sheet shape or a film shape. In case that the elastic member has the sheet shape or film shape, this elastic member can be expanded and contracted in the diametrical direction. Further, the elastic member may be made of a resin such as Polytetrafluoroethylene (PTFE). If the spring member 25 is formed of the resin, the damage on the edge ring 24 and the electrostatic chuck 20 may be suppressed.

Modification Example

Now, a configuration of a placing table 16 according to a modification example of the exemplary embodiment will be described with reference to FIG. 6A to FIG. 6D. FIG. 6A to FIG. 6D are partially enlarged cross sectional views illustrating an electrostatic chuck 20 and an edge ring 24 of the placing table 16 according to the modification example.

The placing table 16 according to the modification example includes an edge ring 24 disposed to surround the wafer W and having a recess portion 24a formed at a lower portion thereof; and an electrostatic chuck 20 having a placing surface 120, a placing surface 121 and a second electrode 21 embedded therein to face the placing surface 121. Further, a recess portion 20c is formed at the placing surface 121 of the electrostatic chuck 20 according to the modification example. The recess portion 24a corresponds to a first recess portion, and the recess portion 20c corresponds to a second recess portion. Further, in the placing table 16 according to the modification example, an insulator ring 26 may be provided or omitted.

Figure 6:
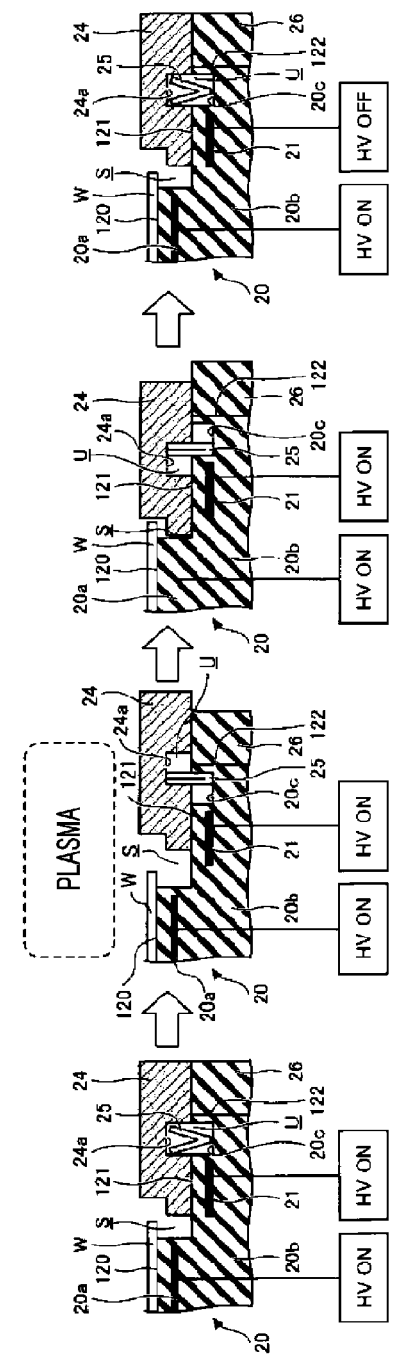
FIG. 6A to FIG. 6D are diagrams illustrating an example of positioning of the edge ring according to a modification example of the exemplary embodiment.

FIG. 6A illustrates an initial state of positions of the electrostatic chuck 20 and the edge ring 24. In the initial state, the edge ring 24 is positioned to be substantially concentric with the electrostatic chuck 20. The recess portion 20c is formed at the placing surface 121. A spring member 25 is provided in a space U surrounded by the recess portion 24a provided at the lower portion of the edge ring 24 and the recess portion 20c formed at the placing surface 121. The spring member 25 is configured to be expanded and contracted in a diametrical direction.

FIG. 6B illustrates an example of a state in which a temperature of the edge ring 24 is set to have a first temperature due to heat input from plasma during a plasma processing. The edge ring 24 having a larger linear expansion coefficient than the electrostatic chuck 20 is expanded outward. Accordingly, the spring member 25 is pushed outwards in the space U due to the expansion of the edge ring 24. However, the movement of the spring member 25 is suppressed by an outer wall of the recess portion 20c of the electrostatic chuck 20, and the spring member 25 in the contracted state in the diametrical direction stops the outward movement of the edge ring 24.

FIG. 6C illustrates an example of a state in which the edge ring 24 is contracted when the edge ring 24 is set to have a second temperature lower than the first temperature since the plasma is extinguished after the plasma processing. Since a DC voltage HV is applied to the second electrode 21 even after the plasma processing, the edge ring 24 is contracted while being attracted to the electrostatic chuck 20. Accordingly, the spring member 25 is pushed inwards in the space U due to the contraction of the edge ring 24. However, the movement of the spring member 25 is suppressed by an inner wall of the recess portion 20c of the electrostatic chuck 20, and the spring member 25 stops the inward movement of the edge ring 24.

After the edge ring 24 is set to have the second temperature in FIG. 6C, the application of the DC voltage HV to the second electrode 21 is stopped as shown in FIG. 6D. Accordingly, the edge ring 24 is released from an electrostatic attracting force to the electrostatic chuck 20 and can be freely movable. In this state, the spring member 25 is returned to the state shown in FIG. 6D where the spring member 25 is expanded in the diametrical direction from the state shown in FIG. 6C where the spring member 25 is contracted in the diametrical direction. Accordingly, the edge ring 24 can be re-arranged at the position where the edge ring 24 is substantially concentric with the electrostatic chuck 20.

As stated above, in the placing table 16 according to the modification example, it is also possible to manage the clearance S between the edge ring 24 and the electrostatic chuck 20 through the above-described aligning operation of the edge ring 24. Therefore, the abnormal discharge can be suppressed, and the particle generation can be avoided.

Further, after the operation of aligning the edge ring 24 by "turning off the DC voltage" as shown in FIG. 6D, the DC voltage is applied again, and the plasma processing upon a next wafer W is performed as shown in FIG. 6B. The processes of FIG. 6B to FIG. 6D are repeated.

[Positioning Method of Edge Ring]

Figure 7:
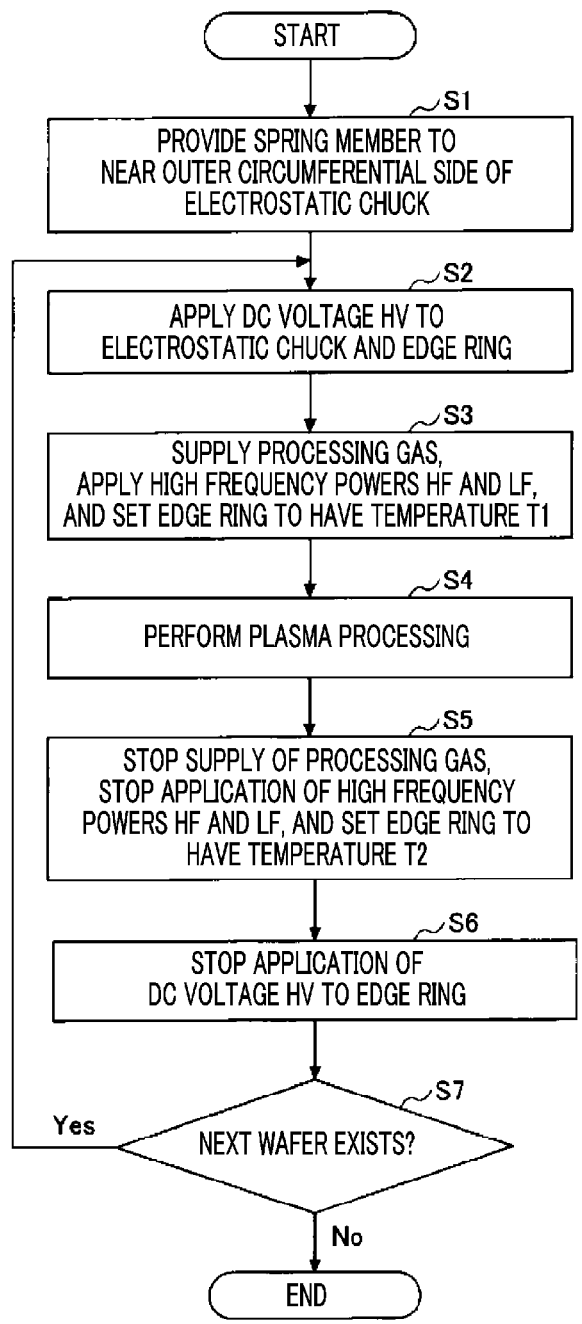
FIG. 7 is a flowchart illustrating an example of a positioning processing of the edge ring according to the exemplary embodiment and the modification example.

Now, a positioning method of the edge ring according to the exemplary embodiment will be explained with reference to a flowchart of FIG. 7. This processing is mainly controlled by the controller 200.

Upon the start of the present processing is begun, the spring member 25 is provided to near the outer circumferential side of the electrostatic chuck 20 (process S1). Then, the wafer W is carried into the processing vessel 10 and placed on the placing surface 120 of the electrostatic chuck 20.

Thereafter, the DC voltage HV is applied to the first electrode 20a and the second electrode 21 of the electrostatic chuck 20 (process S2). Subsequently, the processing gas is supplied from the processing gas source 66, and the high frequency power HF for plasma formation and the high frequency power LF for ion attraction are applied from the first high frequency power supply 90 and the second high frequency power supply 48, respectively. As a result, the plasma is formed. The edge ring 24 is set to have the first temperature T1 by the heat input from the plasma (process S3), and the plasma processing such as etching is performed on the wafer W by the formed plasma (process S4).

Upon the completion of the plasma processing, the supply of the processing gas from the processing gas source 66 is stopped, and the application of the high frequency power HF for plasma formation and the high frequency power LF for ion attraction from the first high frequency power supply 90 and the second high frequency power supply 48 are stopped (process S5). As a result, the plasma is extinguished, and the edge ring 24 is set to have the second temperature T2. The second temperature T2 is a temperature different from the first temperature T1, and is lower than the first temperature T1. The second temperature T2 may be higher than the first temperature T1 as long as it is different from the first temperature T1.

Then, after a lapse of a preset time, the application of the DC voltage HV to the edge ring 24 is stopped (process S6). Accordingly, the edge ring 24 is released from the electrostatic attracting force to the electrostatic chuck 20 and is freely movable. Accordingly, by the elastic force of the spring member 25, the edge ring 24 can be aligned to be substantially concentric with the electrostatic chuck 20. Thus, the clearance S between the edge ring 24 and the electrostatic chuck 20 can be managed, so that the abnormal discharge can be suppressed and the particle generation can be avoided.

Furthermore, a time required for the temperature of the edge ring 24 to be decreased (or increased) to some extent is previously set as the preset time in the process S6. Since the inside of the substrate processing apparatus 1 is under a vacuum atmosphere, heat transfer property is poor as compared to an atmospheric atmosphere. In consideration of this, it is desirable to set, as the preset time, an enough time during which the edge ring 24 is attracted to the electrostatic chuck 20 and the heat of the edge ring 24 is effectively transferred to the electrostatic chuck 20. Accordingly, a time required to decrease (or increase) the temperature of the edge ring 24 to the preset temperature can be shortened.

Subsequently, it is determined whether there is a next wafer W to be processed (process S7). If it is found in the process S7 that the next wafer W exists, the processing returns to the process S2, and the wafer processing is performed from the process S2. If it is found in the process S7 that there is no next wafer W to be processed, the present processing is ended.

As stated above, by using the placing table 16 and the positioning method of the edge ring 24 according to the present exemplary embodiment, it is possible to manage the clearance S between the edge ring 24 and the electrostatic chuck 20. Therefore, the abnormal discharge is suppressed, and the particle generation can be avoided.

The placing table, the positioning method of the edge ring and the substrate processing apparatus according to exemplary embodiment are not intended to be anyway limiting. Further, the exemplary embodiments may be changed and modified in various ways without departing from the scope of the present disclosure as claimed in the following claims. Unless contradictory, the disclosures in the various exemplary embodiments can be combined appropriately.

The substrate processing apparatus may be applicable to any of various types such as capacitively coupled plasma (CCP), inductively coupled plasma (ICP), radial line slot antenna (RLSA), electron cyclotron resonance plasma (ECR) and helicon wave plasma (HWP).

In the present disclosure, the wafer W is described as the example of the substrate. However, the substrate is not limited thereto and may be any of various substrates used in a FPD (Flat Panel Display), a print substrate, or the like.

According to the exemplary embodiment, the gap between the facing sidewalls of the edge ring and the electrostatic chuck can be managed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A placing table, comprising:
an edge ring disposed to surround a substrate, the edge ring having a first recess portion at a lower portion thereof;
an electrostatic chuck having a first placing surface on which the substrate is placed, a second placing surface on which the edge ring is placed, and an electrode embedded therein to face the second placing surface;
an annular member disposed to surround the electrostatic chuck, the annular member having a second recess portion; and
an elastic member disposed in a space surrounded by the first recess portion, the electrostatic chuck and the second recess portion.

2. The placing table of claim 1,
wherein the elastic member is a single elastic member arranged in a circumferential direction or the elastic member includes multiple elastic members arranged in the circumferential direction.

3. The placing table of claim 1,
wherein the elastic member is of a sheet shape, a film shape or a spring shape.

4. The placing table of claim 1,
wherein the elastic member is configured to be expanded and contracted in a circumferential direction or a diametrical direction.

5. The placing table of claim 1,
wherein the elastic member is made of a resin.

6. The placing table of claim 3,
wherein the elastic member is configured to be expanded and contracted in a circumferential direction or a diametrical direction.

7. The placing table of claim 6,
wherein the elastic member is made of a resin.

8. The placing table of claim 7,
wherein the elastic member is a single elastic member arranged in a circumferential direction or the elastic member includes multiple elastic members arranged in the circumferential direction.

9. A substrate processing apparatus comprising a placing table,
wherein the placing table comprises:
an edge ring disposed to surround a substrate, the edge ring having a first recess portion at a lower portion thereof;
an electrostatic chuck having a first placing surface on which the substrate is placed, a second placing surface on which the edge ring is placed, and an electrode embedded therein to face the second placing surface;
an annular member disposed to surround the electrostatic chuck, the annular member having a second recess portion; and
an elastic member disposed in a space surrounded by the first recess portion, the electrostatic chuck and the second recess portion.

10. A substrate processing apparatus comprising a placing table,
wherein the placing table comprises:
an edge ring disposed to surround a substrate, the edge ring having a first recess portion at a lower portion thereof;
an electrostatic chuck having a first placing surface on which the substrate is placed, a second placing surface on which the edge ring is placed, and an electrode embedded therein to face the second placing surface, the second placing surface being provided with a second recess portion; and
an elastic member disposed in a space surrounded by the first recess portion and the second recess portion.

11. A placing table, comprising:
an edge ring disposed to surround a substrate, the edge ring having a first recess portion at a lower portion thereof;
an electrostatic chuck having a first placing surface on which the substrate is placed, a second placing surface on which the edge ring is placed, and an electrode embedded therein to face the second placing surface, the second placing surface being provided with a second recess portion; and
an elastic member disposed in a space surrounded by the first recess portion and the second recess portion.

* * * * *